(12) United States Patent
Hiraki et al.

(10) Patent No.: US 10,418,546 B2
(45) Date of Patent: Sep. 17, 2019

(54) MAGNETIC SENSOR

(71) Applicant: TDK Corporation, Tokyo (JP)

(72) Inventors: Tetsuya Hiraki, Tokyo (JP); Naoki Ohta, Tokyo (JP); Hiraku Hirabayashi, Tokyo (JP); Yoshiaki Tanaka, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 15/835,628

(22) Filed: Dec. 8, 2017

(65) Prior Publication Data
US 2018/0261760 A1    Sep. 13, 2018

(30) Foreign Application Priority Data

Mar. 13, 2017    (JP) ................ 2017-047258

(51) Int. Cl.
  *H01L 43/02*    (2006.01)
  *H01L 27/22*    (2006.01)

(52) U.S. Cl.
  CPC .............. *H01L 43/02* (2013.01); *H01L 27/22* (2013.01)

(58) Field of Classification Search
  CPC ..... H01L 43/08; G01R 33/093; G01R 33/098; G01R 33/09; G01R 33/096
  USPC .......................... 257/295, E43.001–E43.007, 257/E27.005–E27.006, E27.008, E29.164, 257/E29.167, E29.272, E29.323; 427/124–132
  See application file for complete search history.

(56) References Cited

U.S. PATENT DOCUMENTS

| | | | | |
|---|---|---|---|---|
| 6,807,086 B2* | 10/2004 | Kajiyama | ............... | G11C 11/15 365/157 |
| 2013/0119980 A1* | 5/2013 | Ogomi | ................. | G01R 33/091 324/252 |
| 2013/0278250 A1* | 10/2013 | Raberg | ................... | G01R 33/09 324/252 |
| 2015/0325624 A1* | 11/2015 | Roizin | .................... | H01L 43/10 257/421 |
| 2016/0018479 A1* | 1/2016 | Cambou | ............. | G11C 11/1659 324/252 |

FOREIGN PATENT DOCUMENTS

| | | |
|---|---|---|
| JP | 59-195888 A | 11/1984 |
| JP | 62-266479 A | 11/1987 |
| JP | 2001-102659 A | 4/2001 |
| JP | 2007-250584 A | 9/2007 |
| JP | 2008-085349 A | 4/2008 |
| JP | 2008-170368 A | 7/2008 |
| WO | 2009/078296 A1 | 6/2009 |

OTHER PUBLICATIONS

Office Action dated Mar. 28, 2018 issued in corresponding JP patent application No. 2017-047258 (English translation only).

* cited by examiner

*Primary Examiner* — Jonathan Han
(74) *Attorney, Agent, or Firm* — Posz Law Group, PLC

(57) ABSTRACT

A magnetic sensor is provided which can improve density of magnetoresistance effect elements without narrowing the wiring pitch. A plurality of element array layers 10 are stacked one on another, each of the element array layers including a plurality of magnetoresistance effect elements 1 arranged in parallel in an in-plane direction, and magnetoresistance effect elements 1 in the plurality of element array layers 10 are connected in series to each other.

12 Claims, 10 Drawing Sheets

US 10,418,546 B2

MAGNETIC SENSOR

BACKGROUND OF THE INVENTION

Field of the Invention

The present invention relates to a magnetic sensor for measuring a magnetic field.

Description of the Related Art

Magnetic sensors are known in which magnetoresistance effect elements such as GMR (giant magneto resistance) effect elements or TMR (tunnel magneto resistance) effect elements are arranged in parallel in an in-plane direction. For such magnetic sensors, it is generally effective to increase the number of magnetoresistance effect elements in order to reduce the influence of noise and to improve detection accuracy. From the standpoint of size and cost of a magnetic sensor, it is important to more densely arrange the magnetoresistance effect elements and to increase the density of the magnetoresistance effect elements rather than to simply increase the number of magnetoresistance effect elements.

Conventionally, a method of narrowing the wiring pitch, which is represented by the sum of a wiring width and a wiring interval of wiring connecting magnetoresistance effect elements, has been used to densely arrange the magnetoresistance effect elements. However, this method involves problems such as an increase in wiring resistance and an increase in difficulty in wiring formation, and further a cost increase caused by an increase in the precision of various facilities that are used to create a magnetic sensor such as an exposure apparatus.

JP2008-85349A discloses a magnetic random access memory in which TMR arrays are stacked one on another in a plurality of rows and TMR elements are connected in parallel to each other. This configuration allows the TMR elements to be integrated without narrowing the wiring pitch.

However, unlike a magnetic sensor, the magnetic random access memory described in JP2008-85349A has the respective TMR elements connected in parallel to each other, and consequently, it is not applicable to a magnetic sensor.

It is an object of the present invention to provide a magnetic sensor in which density of magnetoresistance effect elements can be improved without narrowing the wiring pitch.

SUMMARY OF THE INVENTION

In order to attain the above described object, a magnetic sensor according to the present invention includes a plurality of element array layers stacked one on another, each of the element array layers including a plurality of magnetoresistance effect elements arranged in parallel in an in-plane direction, and the magnetoresistance effect elements in the plurality of element array layers are connected in series to each other.

According to the present invention, it is possible to improve the density of magnetoresistance effect elements without narrowing the wiring pitch.

DETAILED DESCRIPTION OF THE PREFERRED EMBODIMENTS

Figure 1:
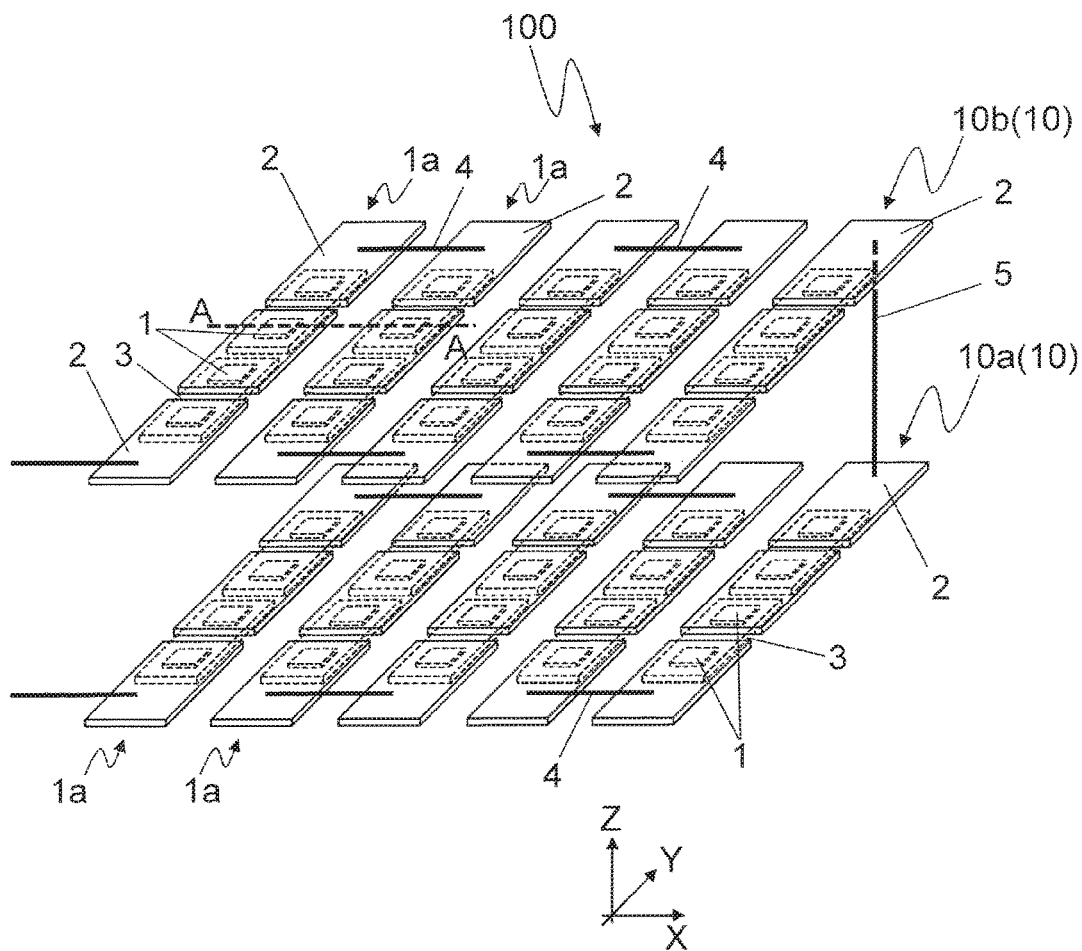
FIG. 1 is a perspective view schematically illustrating main parts of a magnetic sensor according to a first embodiment of the present invention.

Hereinafter, embodiments of the present invention will be described with reference to the accompanying drawings. Note that parts having the same functions among different drawings are assigned the same reference numerals and description thereof may be omitted.

First Embodiment

FIG. 1 is a perspective view schematically illustrating main parts of a magnetic sensor according to a first embodiment of the present invention. Magnetic sensor 100 shown in FIG. 1 has a configuration in which a plurality of element array layers 10, in each of which a plurality of magnetoresistance effect elements 1 are arranged in parallel in an in-plane direction, are stacked one on another. In FIG. 1, the direction in which element array layers 10 are stacked is assumed to be a Z-direction and the two directions orthogonal to the Z-direction are assumed to be an X-direction and a Y-direction respectively. Hereinafter, the positive direction of the Z-direction is assumed to be an upward direction and the negative direction thereof is assumed to be a downward direction.

In the example in FIG. 1, element array layer 10 has two stacked layers, but may also have three or more stacked layers. Hereinafter, lower element array layer 10 may be called "element array layer 10a" and upper element array layer 10 may be called "element array layer 10b." In each element array layer 10, magnetoresistance effect elements 1 are arranged in parallel to each other within an XY plane in a matrix form, while magnetoresistance effect elements 1 in different element array layers 10 are arranged in parallel to each other in the Z-direction.

The plurality of magnetoresistance effect elements 1 included in element array layers 10a and 10b (all magnetoresistance effect elements 1 in the example in FIG. 1) are connected in series to each other. According to the present embodiment, the plurality of magnetoresistance effect elements 1 in element array layer 10 are connected in series to each other, and furthermore, any one of magnetoresistance effect elements 1 in element array layer 10 is connected in series to any one of magnetoresistance effect elements 1 in other element array layer 10. Magnetoresistance effect element 1 to be connected to another magnetoresistance effect element 1 in other element array layer 10 is, more specifically, last stage or forefront stage magnetoresistance effect element 1 among the plurality of magnetoresistance effect elements 1 serially connected in element array layer 10, that is, magnetoresistance effect element 1 with other magnetoresistance effect element 1 in same element array layer 10 connected to one side only.

Note that in the example in FIG. 1, since element array layer 10 is composed of two layers, other element array layer 10 constitutes adjacent element array layer 10. When element array layer 10 is composed of three or more layers, other element array layer 10 to which magnetoresistance effect elements 1 in element array layer 10 are connected may be adjacent element array layer 10 or non-adjacent element array layer 10, but adjacent element array layer 10 is preferable from the standpoint of ease of configuration or the like.

Hereinafter, a configuration of magnetic sensor 100 will be described in more detail.

At both ends in the Z-direction of each magnetoresistance effect element 1, upper electrode layer 2 and lower electrode layer 3 are arranged so as to contact magnetoresistance effect element 1. Thus, each magnetoresistance effect element 1 is electrically connected to upper electrode layer 2 and lower electrode layer 3. Upper electrode layer 2 and lower electrode layer 3 extend in a predetermined direction within the XY plane (Y-direction in the example in FIG. 1) and two magnetoresistance effect elements 1 adjacent in the Y-direction share upper electrode layer 2 or lower electrode layer 3. In other words, two magnetoresistance effect elements 1 adjacent in the Y-direction are connected to each other via upper electrode layer 2 or lower electrode layer 3. For this reason, the plurality of magnetoresistance effect elements 1 arranged in parallel in the Y-direction are connected in series to each other. Hereinafter, the plurality of magnetoresistance effect elements 1 arranged in parallel in the Y-direction may be called "element array 1a."

Two element arrays 1a adjacent in the X-direction are connected to each other with electrode layers at an end in the Y-direction (upper electrode layers 2 in the example in FIG. 1) being connected to each other via a lead wire 4. Therefore, magnetoresistance effect elements 1 in two element arrays 1a adjacent in the X-direction are connected in series to each other. Furthermore, when other element arrays are contiguous on both sides in the X-direction of element array 1a, one of adjacent element arrays is connected to one end in the Y-direction of element array 1a, and the other end of the adjacent element array is connected to the other end in the Y-direction of element array 1a. When a adjacent element array exists only on one side in the X-direction of element array 1a, one end in the Y-direction of element array 1a is connected to the adjacent element array. Thus, for each element array layer 10, a plurality of magnetoresistance effect elements 1 in element array layer 10 are connected in series to each other.

Element arrays 1a of element array layer 10a and 10b in which adjacent element arrays are present only on one side in the X-direction are connected to each other with electrode layers located at an end in the Y-direction of those not connected to the adjacent element arrays (upper electrode layers 2 in the example in FIG. 1) being connected to each other via lead wire 5. In this way, all magnetoresistance effect elements 1 in element array layers 10a and 10b are connected in series to each other.

Figure 2:
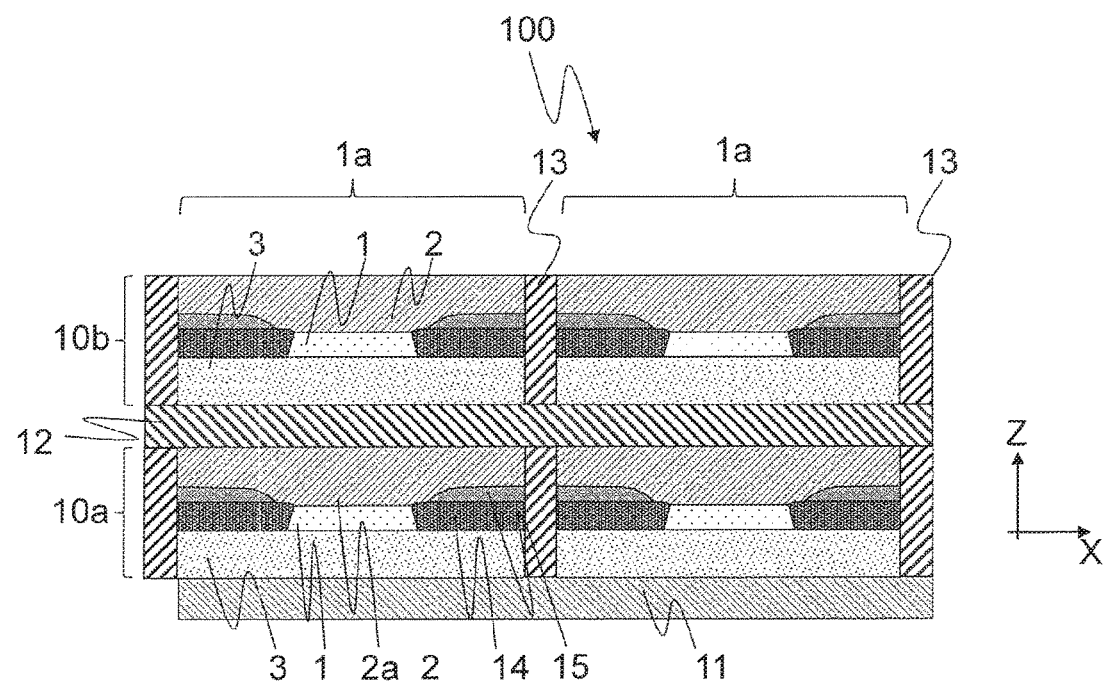
FIG. 2 is a cross-sectional view along line A-A in FIG. 1.

Next, a stacked structure of magnetic sensor 100 will be described more specifically. FIG. 2 is a diagram for describing a stacked structure of magnetic sensor 100 and is a cross-sectional view along a line A-A in FIG. 1.

As shown in FIG. 2, magnetic sensor 100 includes element array layer 10a, inter-layer insulating layer 12 and element array layer 10b which are stacked one on another in that order on substrate 11. Substrate 11 is formed of, for example, silicon (Si). Inter-layer insulating layer 12 is formed of, for example, silicon dioxide ($SiO_2$) or aluminum oxide ($Al_2O_3$).

In element array layer 10a, element arrays 1a are arranged in parallel in the X-direction at an interval. Insulating layer 13 is formed between element arrays 1a. Insulating layer 13 may be formed of the same material as or a material different from that of inter-layer insulating layer 12.

In each element array 1a, lower electrode layer 3, magnetoresistance effect element 1 and upper electrode layer 2 are formed in that order on substrate 11. Upper electrode layer 2 and lower electrode layer 3 are formed of a conductive substance such as gold (Au) or copper (Cu). Upper electrode layer 2 and lower electrode layer 3 are larger than magnetoresistance effect element 1. For this reason, there is an area where no magnetoresistance effect element 1 is formed between upper electrode layer 2 and lower electrode layer 3, and insulating layer 14 is formed therein. In the present embodiment, insulating layer 14 is arranged so as to surround magnetoresistance effect element 1 within the XY plane. Insulating layer 14 may be formed of the same material as or a material different from that of at least one of inter-layer insulating layer 12 and insulating layer 13.

Upper electrode layer 2 includes downward convex portion 2a and convex portion 2a is in contact with magnetoresistance effect element 1. Insulating layer 15 is formed so as to surround convex portion 2a within the XY plane. Insulating layer 15 may be formed of the same material as or a material different from that of at least one of inter-layer insulating layer 12, insulating layers 13 and 14.

Since element array layer 10b has the same configuration as that of element array layer 10a, detailed description thereof is omitted. Although lead wire 4 shown in FIG. 1 is not shown in FIG. 2, lead wire 4 can be formed, for example, by providing a conductive layer instead of insulating layer 15 between upper electrode layers 2 of each element array 1a. Similarly, lead wire 5 shown in FIG. 1 can be formed using a via or the like provided in inter-layer insulating layer 12. Note that in FIG. 1, substrate 11, inter-layer insulating layer 12, insulating layer 13, insulating layer 14 and insulating layer 15 are omitted to make drawings easy to see.

In the manufacturing step of magnetic sensor 100, element array layer 10a is formed on substrate 11 using a step similar to the manufacturing step of a conventional single-layer magnetic sensor first. Inter-layer insulating layer 12 is formed (film formation) on element array layer 10a and inter-layer insulating layer 12 is planarized using CMP (chemical mechanical polishing). Element array layer 10b is formed on planarized inter-layer insulating layer 12 using a step similar to the formation step of element array layer 10a. A via is formed in inter-layer insulating layer 12 so that magnetoresistance effect elements 1 in element array layers 10a and 10b are connected to each other.

The type of magnetoresistance effect element 1 used in magnetic sensor 100 is not particularly limited. For example, a GMR element, TMR element, AMR (anisotropic magneto resistance) effect element or SMR (semiconductor magneto resistance) element can be used as magnetoresistance effect element 1.

Figure 3:
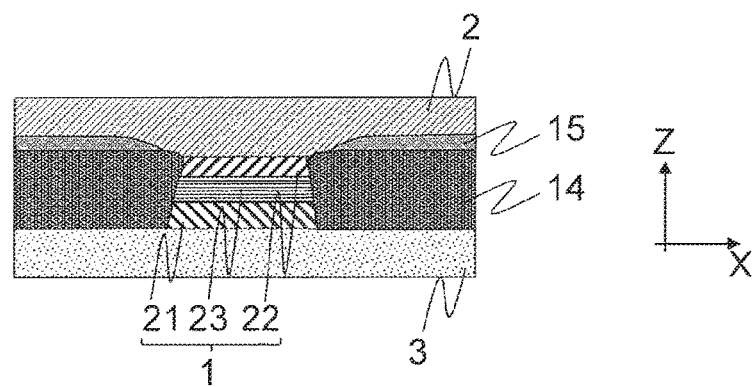
FIG. 3 is an enlarged view of the vicinity of the magnetoresistance effect element in FIG. 2.

FIG. 3 is a diagram illustrating an example of magnetoresistance effect element 1, showing the vicinity of magnetoresistance effect element 1 in FIG. 2. Magnetoresistance effect element 1 shown in FIG. 3 is a GMR element or TMR element and includes fixed magnetization layer 21, free layer 22 and non-magnetic layer 23. Non-magnetic layer 23 is disposed between fixed magnetization layer 21 and free layer 22. In the example in FIG. 3, fixed magnetization layer 21, non-magnetic layer 23 and free layer 22 are stacked one on another in that order on lower electrode layer 3.

The orientation of magnetization is fixed in fixed magnetization layer 21. In other words, the orientation of magnetization of fixed magnetization layer 21 is not changed by an external magnetic field (magnetic field detected by magnetic sensor 100). The orientation of magnetization of free layer 22 is changed depending on an external magnetic field. Non-magnetic layer 23 causes magnetization of fixed magnetization layer 21 and magnetization of free layer 22 to interact with each other to express magnetoresistance effects. When magnetoresistance effect element 1 is a TMR element, non-magnetic layer 23 is a tunnel barrier layer formed of a non-magnetic insulating material, while when magnetoresistance effect element 1 is a GMR element, non-magnetic layer 23 is a non-magnetic conductive layer formed of a non-magnetic conductive material.

Magnetoresistance effect elements 1 included in magnetic sensor 100 are preferably of the same kind, and when they have the configuration shown in FIG. 3, the orientation of magnetization of fixed magnetization layers 21 is preferably uniform.

As described above, according to the present embodiment, a plurality of element array layers 10 in which a plurality of magnetoresistance effect elements 1 are arranged in parallel in an in-plane direction are stacked one on another and magnetoresistance effect elements 1 in the plurality of element array layers 10 are connected in series to each other. Therefore, it is possible to improve the density of magnetoresistance effect elements without narrowing the wiring pitch.

Furthermore, according to the present embodiment, magnetoresistance effect elements 1 in element array layer 10 are connected in series to each other for each element array layer 10 and any one of magnetoresistance effect elements 1 is connected in series to any one of the plurality of magnetoresistance effect elements 1 in an element array layer that is different from element array layer 10. In this case, it is possible to form each element array layer 10 in a step similar to that of a conventional single-layer magnetic sensor, and thereby easily manufacture magnetic sensor 100.

Furthermore, according to the present embodiment, the orientation of magnetization of fixed magnetization layers 21 of magnetoresistance effect elements 1 is uniform, and it is thereby possible for each magnetoresistance effect element 1 to detect an external magnetic field in the same direction, and to efficiently improve the detection accuracy of magnetic sensor 100.

Second Embodiment

Figure 4:
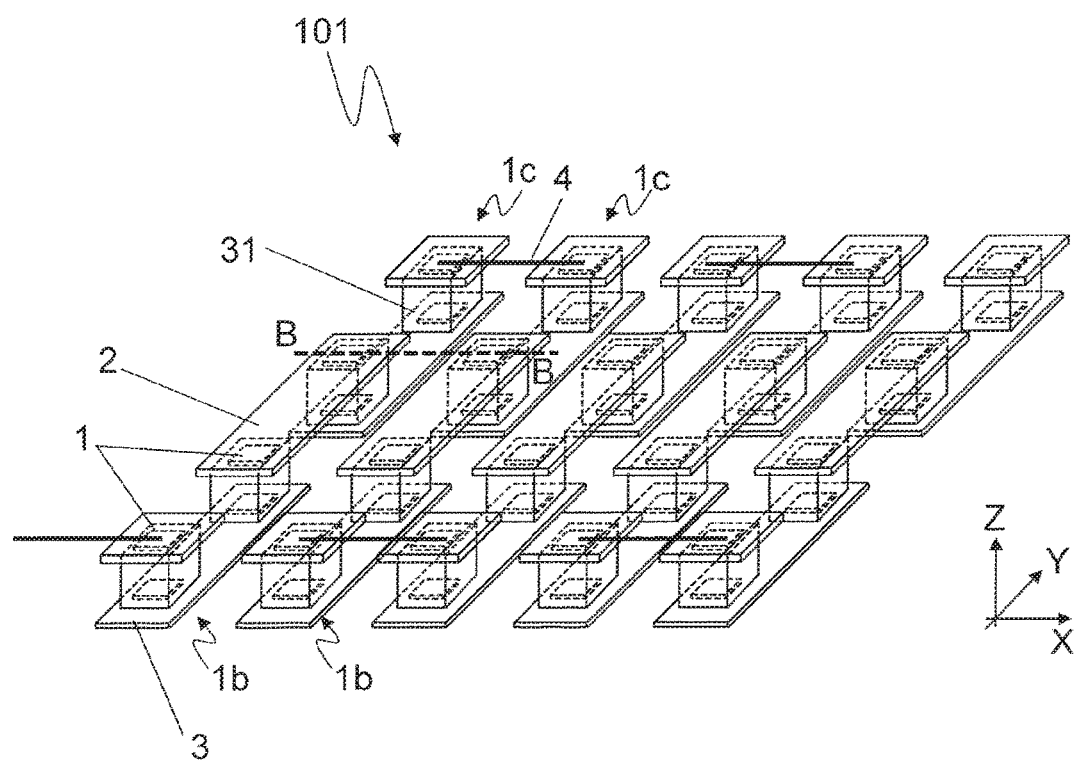
FIG. 4 is a perspective view schematically illustrating main parts of a magnetic sensor according to a second embodiment of the present invention.
Figure 5:
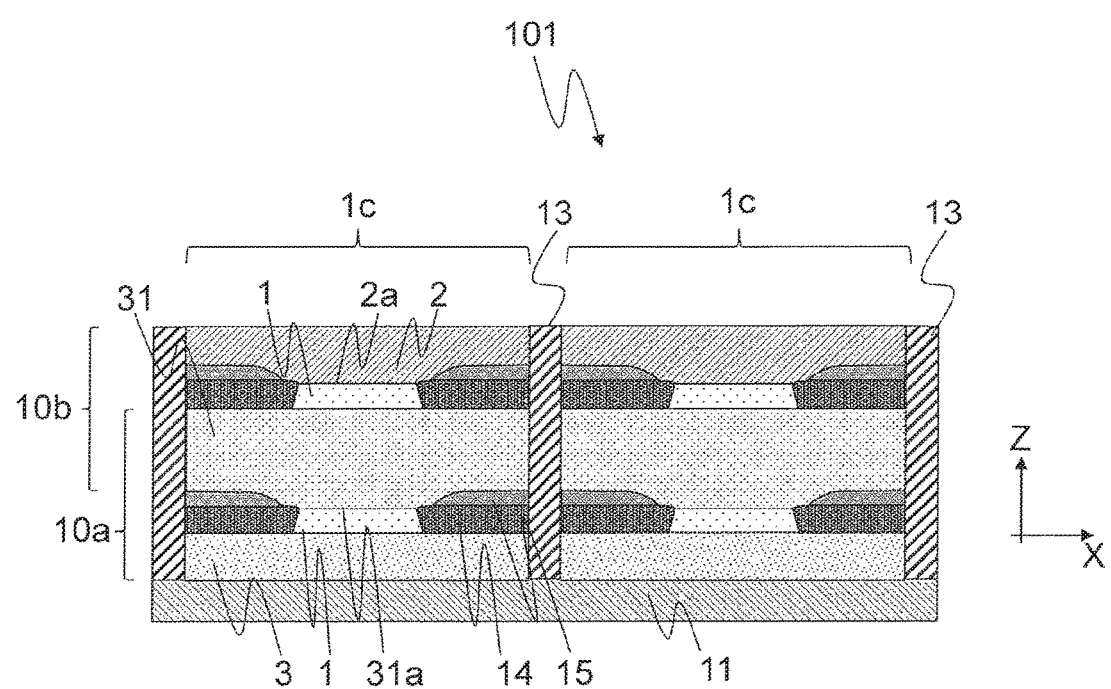
FIG. 5 is a cross-sectional view along line B-B in FIG. 4.

FIG. 4 is a perspective view schematically illustrating main parts of a magnetic sensor according to a second embodiment of the present invention and FIG. 5 is a cross-sectional view along a line B-B in FIG. 4. Magnetic sensor 101 of the present embodiment shown in FIG. 4 and FIG. 5 is different from magnetic sensor 100 according to the first embodiment shown in FIG. 1 to FIG. 3 in a connection configuration whereby magnetoresistance effect elements 1 are connected to each other.

In magnetic sensor 101, a plurality of multi-layered elements 1b are formed in which magnetoresistance effect elements 1 in element array layer 10 are connected in series to adjacent magnetoresistance effect elements 1 in the Z-direction respectively, and respective multi-layered elements 1b are connected in series to each other.

More specifically, of adjacent element array layers 10a and 10b in magnetic sensor 101, upper electrode layer 2 of lower element array layer 10a and lower electrode layer 3 of upper element array layer 10b are shared as intermediate electrode layer 31. In other words, upper electrode layer 2 and lower electrode layer 3 located between adjacent magnetoresistance effect elements 1 in multi-layered element 1b are shared as intermediate electrode layer 31. Intermediate electrode layer 31 includes downward convex portion 31a and convex portion 31a is in contact with a magnetoresistance effect element of element array layer 10a.

At least one of upper electrode layer 2 connected to lowest magnetoresistance effect element 1 of multi-layered element 1b (magnetoresistance effect element 1 of element array layer 10a) and lower electrode layer 3 connected to top magnetoresistance effect element 1 of multi-layered element 1b (magnetoresistance effect element 1 of element array layer 10b) extends in the Y-direction which is a predetermined direction. Adjacent magnetoresistance effect elements 1 in the Y-direction share extending upper electrode layer 2 or lower electrode layer 3. For this reason, a plurality of multi-layered elements 1b arranged in parallel in the Y-direction are connected in series to each other. Hereinafter, the plurality of multi-layered elements 1b arranged in parallel in the Y-direction may also be called "element array 1c."

Two element arrays 1c adjacent in the X-direction are connected to each other with electrode layers located at an end in the Y-direction (upper electrode layers 2 in the example in the drawings) being connected via lead wire 4 as in the case of element arrays 1a of the first embodiment. Thus, all magnetoresistance effect elements 1 in element array layers 10a and 10b are connected in series to each other.

According to the manufacturing method of magnetic sensor 101, element array layer 10a is formed on substrate 11 using a step similar to the manufacturing step of the conventional single-layer magnetic sensor first. Intermediate electrode layer 31 which is an upper electrode layer of element array layer 10a is planarized using CMP and element array layer 10b using intermediate electrode layer 31 as its lower electrode layer is then formed on intermediate electrode layer 31.

According to the present embodiment, each of magnetoresistance effect elements 1 in element array layer 10 includes a plurality of multi-layered elements 1b connected in series to magnetoresistance effect elements 1 adjacent in the Z-direction and respective multi-layered elements 1b are connected in series to each other. In this case, since there is no need to provide inter-layer insulating layer 12 or the like for insulating magnetoresistance effect elements 1 in the Z-direction, it is possible to simplify the configuration and reduce the thickness. In particular, since upper electrode layer 2 and lower electrode layer 3 located between magnetoresistance effect elements 1 adjacent in the Z-direction are shared as intermediate electrode layer 31, it is easy to simplify the configuration and reduce the thickness.

Third Embodiment

Figure 6:
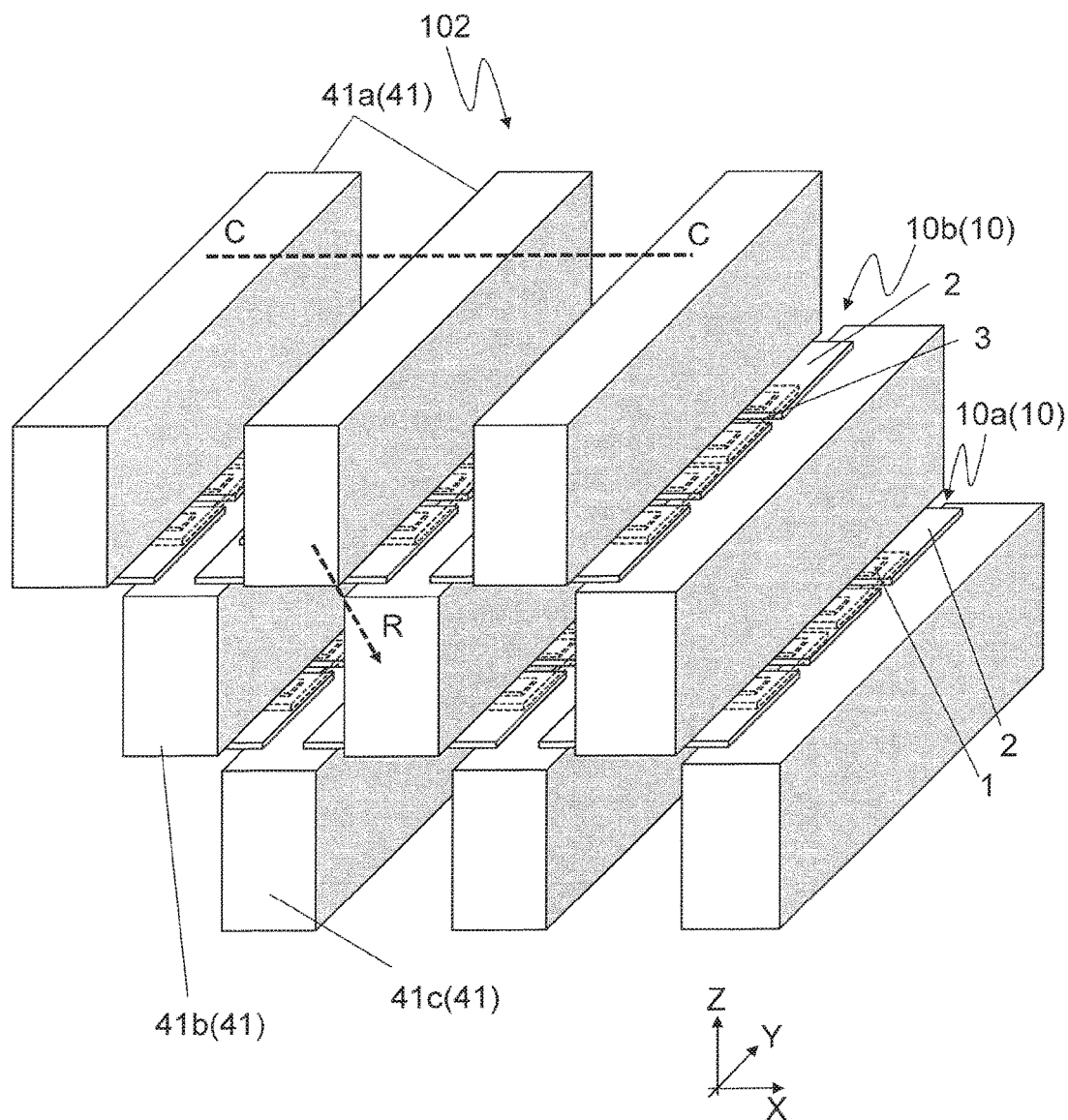
FIG. 6 is a perspective view schematically illustrating main parts of a magnetic sensor according to a third embodiment of the present invention.
Figure 7:
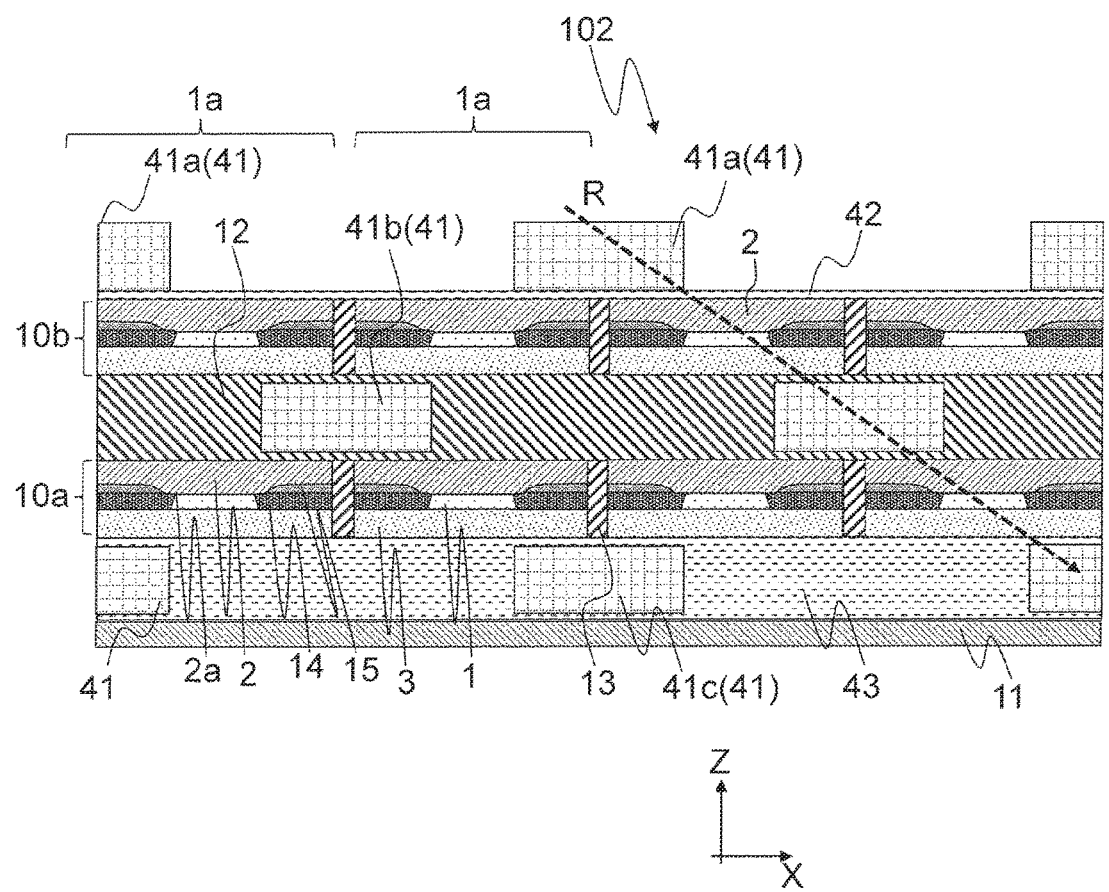
FIG. 7 is a cross-sectional view along line C-C in FIG. 6.

FIG. 6 is a perspective view schematically illustrating main parts of a magnetic sensor according to a third embodiment of the present invention and FIG. 7 is a cross-sectional view along line C-C in FIG. 6. Magnetic sensor 102 of the present embodiment shown in FIG. 6 and FIG. 7 is different from magnetic sensor 100 shown in FIG. 1 and FIG. 2 in that it further includes a plurality of yokes 41 arranged in the vicinity of each magnetoresistance effect element 1.

Yokes 41 are members that efficiently draw an external magnetic field of a specific direction into magnetoresistance effect elements 1. Yokes 41 are preferably formed of a soft magnetic material having high magnetic permeability such as permalloy (NiFe), cobalt iron nickel (CoFeNi) alloy, iron silicon alloy (FeSi), Sendust, nickel-zinc (NiZn) ferrite or manganese-zinc (MnZn) ferrite.

The arrangement positions of yokes 41 vary depending on the type of magnetoresistance effect element 1, the orientation of the external magnetic field to be detected or the like. The thickness (length in the Z-direction), width (length in the X-direction) and shape or the like of yoke 41 are adjusted as appropriate according to constraints on the configuration, desired drawing strength or the like of magnetic sensor 102.

The present embodiment will describe an example suitable for detecting an external magnetic field in the Z-direction using elements that provide magnetoresistance effects through the external magnetic field in a direction within the XY plane as magnetoresistance effect elements 1. In this case, in order to increase the detection accuracy of magnetic sensor 100, yokes 41 are arranged so that the component in the XY plane direction of the external magnetic field that passes through magnetoresistance effect elements 1 increases.

More specifically, yokes 41 are constructed of interposing yokes disposed so as to sandwich each magnetoresistance effect element 1 in an R direction crossing the XY plane without intersecting it orthogonally. More specifically, yoke 41 is provided for each of magnetoresistance effect elements 1 in element array layers 10a and 10b. Yoke 41 provided between two magnetoresistance effect elements 1 adjacent in the R direction is shared by those magnetoresistance effect elements 1 and embedded in inter-layer insulating layer 12 between element array layers 10a and 10b.

For this reason, yokes 41 include upper yokes 41a provided above upper electrode layer 2 of element array layer 10b, intermediate yokes 41b provided between element array layers 10a and 10b, and lower yokes 41c provided below lower electrode layer 3 of element array layer 10a in the Z-direction. Intermediate yokes 41b are sandwiched by magnetoresistance effect element 1 of element array layer 10a and magnetoresistance effect element 1 of element array layer 10b in the R direction.

Insulating layer 42 is provided between upper yokes 41a and upper electrode layer 2 of element array layer 10b. Insulating layer 43 is provided between substrate 11 and lower electrode layer 3 of element array layer 10a, and lower yokes 41c is covered with insulating layer 43.

In the manufacturing step of magnetic sensor 102, insulating layer 43 is formed on substrate 11 and yokes 41c are embedded in insulating layer 43 thereof. Next, insulating layer 43 is planarized using CMP and element array layer 10a is formed on planarized insulating layer 43 using a step similar to the manufacturing step of the conventional single-layer magnetic sensor. In element array layer 10a, the interval (pitch) of magnetoresistance effect elements 1 in the X-direction may be on the same level with that of the conventional single-layer magnetic sensor. Next, inter-layer insulating layer 12 is formed (film formation) on element array layer 10a, and intermediate yokes 41b are embedded in inter-layer insulating layer 12 thereof. Subsequently, inter-layer insulating layer 12 is planarized using CMP and element array layer 10b is formed on planarized inter-layer insulating layer 12 using a step similar to the formation step of element array layer 10a. Furthermore, upper yokes 41a are formed on element array layer 10b via insulating layer 42.

Figure 8:
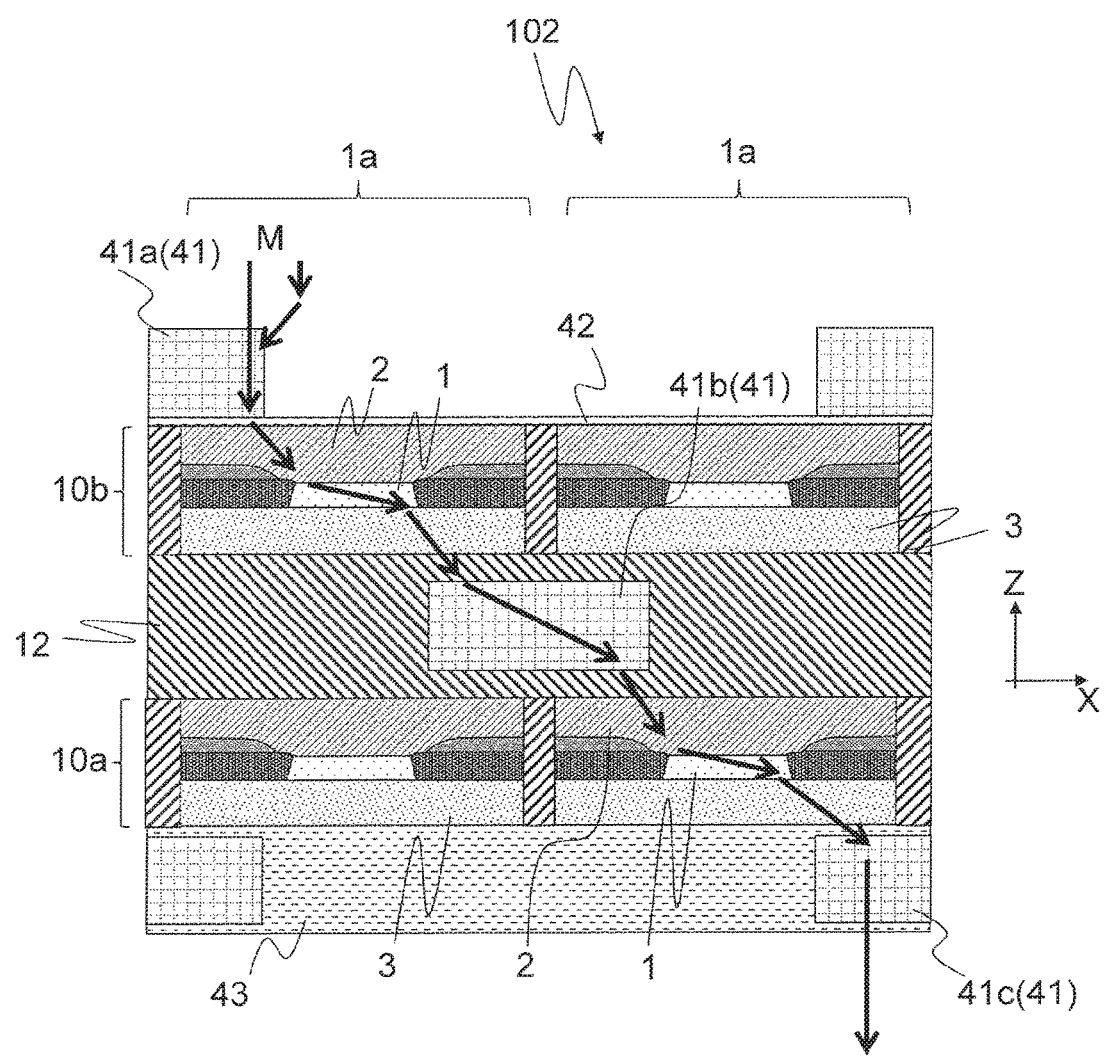
FIG. 8 is a diagram illustrating an external magnetic field passing through the magnetic sensor.

FIG. 8 is a diagram illustrating an external magnetic field (magnetic field detected by magnetic sensor 102) that passes through magnetic sensor 102 shown in FIG. 6 and FIG. 7. When downward external magnetic field M in the Z-direction as shown in FIG. 8 is inputted to magnetic sensor 102, external magnetic field M above and in the vicinity of upper yokes 41a is drawn into upper yokes 41a and turned from upper yokes 41a toward magnetoresistance effect element 1 of element array layer 10b. After passing through magnetoresistance effect element 1, external magnetic field M is drawn into intermediate yokes 41b. External magnetic field M that is drawn into intermediate yokes 41b is further turned toward magnetoresistance effect element 1 of element array layer 10a and drawn into lower yokes 41c after passing through magnetoresistance effect element 1.

Since upper yoke 41a and intermediate yoke 41b, and intermediate yoke 41b and lower yoke 41c are respectively arranged so as to sandwich magnetoresistance effect element 1 in the R direction that crosses the XY plane without intersecting it orthogonally, external magnetic field M diagonally passes through magnetoresistance effect element 1. For this reason, Z-direction downward external magnetic field M can be caused to diagonally pass through magnetoresistance effect element 1 using yokes 41, and it is thereby possible to increase the XY-plane component of the external magnetic field that passes through magnetoresistance effect element 1.

As described above, according to the present embodiment, since yokes 41 are provided in the vicinity of magnetoresistance effect elements 1, it is possible to further improve detection accuracy of magnetic sensor 102. Particularly in the present embodiment, yokes 41 are disposed so as to sandwich magnetoresistance effect elements 1 in the R direction crossing the XY plane without intersecting it orthogonally, and this is therefore suitable for detecting the external magnetic field in the Z-direction.

Of yokes 41 respectively provided for two magnetoresistance effect elements 1 adjacent in the R direction, intermediate yoke 41b provided on the adjacent magnetoresistance effect element 1 side is embedded between element array layers 10a and 10b in the present embodiment. For this reason, it is possible to arrange components in element array layer 10a such as upper electrode layer 2 and lower electrode layer 3 above or below intermediate yoke 41b, and thereby narrow the interval between magnetoresistance effect elements 1.

According to the present embodiment, of yokes 41 provided for two magnetoresistance effect elements 1 adjacent in the R-direction, yoke 41b provided on the adjacent magnetoresistance effect element 1 side is shared, and it is thereby possible to miniaturize magnetic sensor 102.

Figure 9:
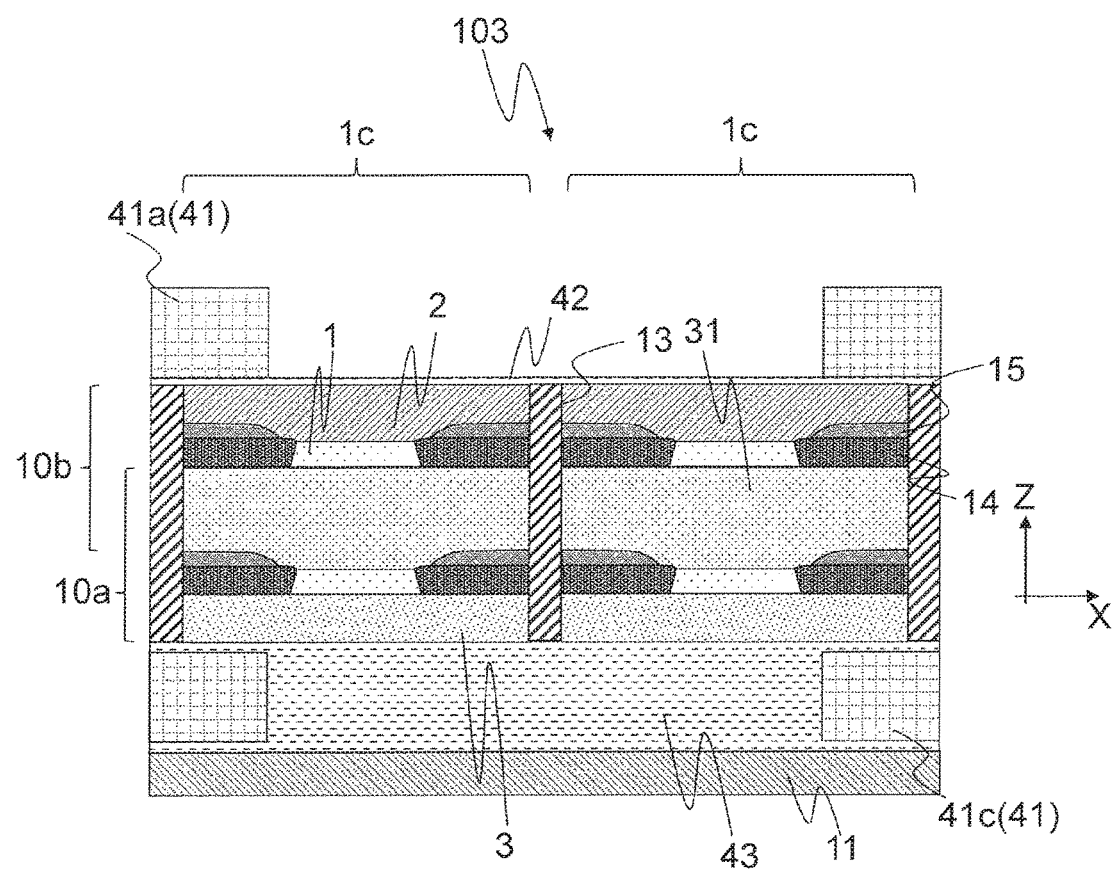
FIG. 9 is a cross-sectional view illustrating a modification of the magnetic sensor according to the third embodiment of the present invention.

FIG. 9 is a diagram for describing another arrangement example of yokes 41. Magnetic sensor 103 shown in FIG. 9 is an arrangement example where yokes 41 are arranged for the magnetic sensor in which upper electrode layer 2 of element array layer 10a and lower electrode layer 3 of element array layer 10b are shared as intermediate electrode layer 31 as in the case of magnetic sensor 101 according to the second embodiment shown in FIG. 4 and FIG. 5.

Magnetic sensor 103 is provided with upper yokes 41a and lower yokes 41c which are interposing yokes in addition to the configuration of magnetic sensor 101 shown in FIG. 5. Upper yokes 41a are provided above upper electrode layer 2 of element array layer 10b and lower yokes 41c are provided below lower electrode layer 3 of element array layer 10a. Furthermore, insulating layer 42 is provided between upper yokes 41a and upper electrode layer 2 of element array layer 10b. Furthermore, insulating layer 43 is provided between substrate 11 and lower electrode layer 3 of element array layer 10a, and lower yokes 41c is covered with insulating layer 43.

In magnetic sensor 103, both magnetoresistance effect element 1 of element array layer 10a and magnetoresistance effect element 1 of element array layer 10b are sandwiched by one set of upper yoke 41a and lower yoke 41c in the R-direction. Such a configuration also allows external magnetic field M in the Z-direction to diagonally pass through magnetoresistance effect element 1.

Figure 10:
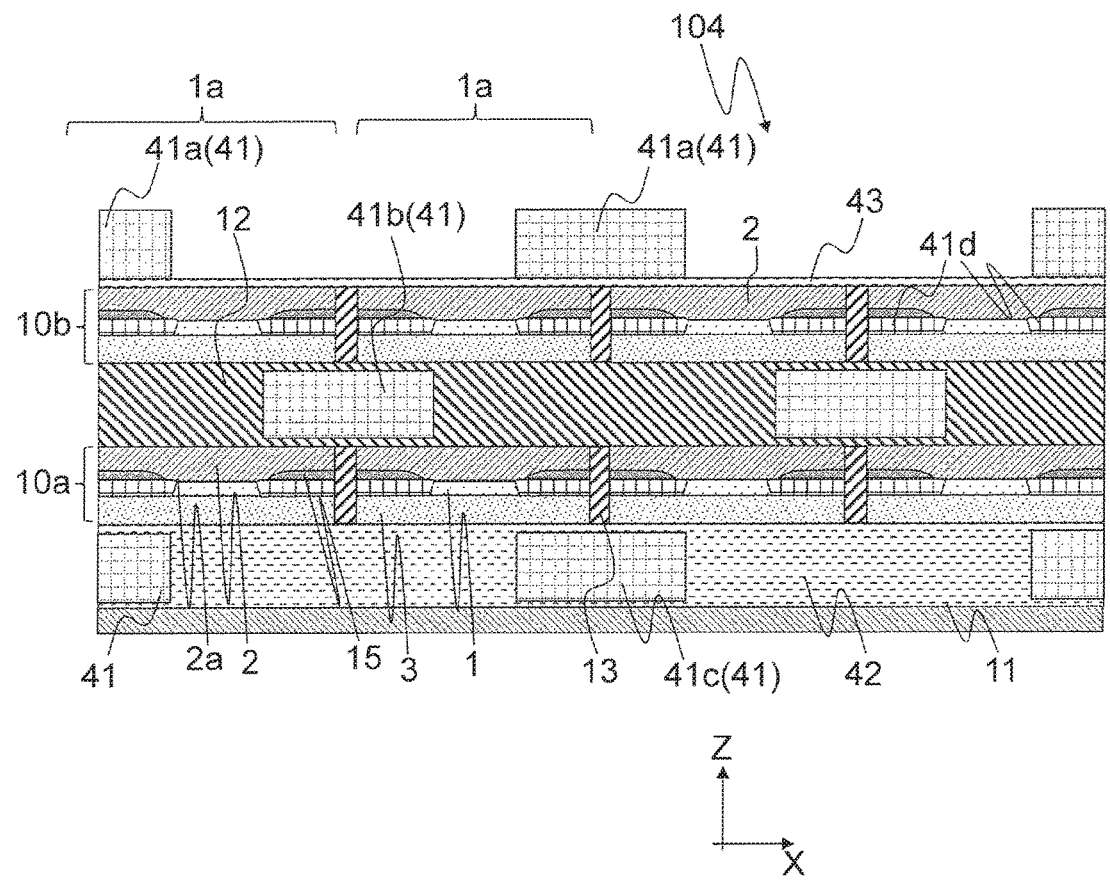
FIG. 10 is a cross-sectional view illustrating another modification of the magnetic sensor according to the third embodiment of the present invention.

FIG. 10 is a diagram for describing another arrangement example of yokes 41. Magnetic sensor 104 shown in FIG. 10 is different in that it is further provided with side yokes 41d disposed on both sides of each magnetoresistance effect element 1 in the in-plane direction of the XY plane in addition to the configuration of magnetic sensor 102 shown in FIG. 8. In the example in FIG. 10, side yokes 41d are provided at the position of insulating layer 14 of magnetic sensor 102 shown in FIG. 8, that is, between upper electrode layer 2 and lower electrode layer 3. Note that an insulating film may be provided between side yokes 41d and magnetoresistance effect element 1, between side yokes 41d and upper electrode layer 2 or between side yokes 41d and lower electrode layer 3.

In the case of the example in FIG. 10, with a magnetic field drawn in by side yokes 41d, it is possible to more accurately detect the magnetic field. Moreover, since side yokes 41d are provided between upper electrode layer 2 and lower electrode layer 3, it is possible to prevent provision of side yokes 41d from causing the size of the magnetic sensor from increasing.

Furthermore, yokes 41 may also have a configuration with upper yokes 41a and lower yokes 41c removed from the configuration shown in FIG. 6 and FIG. 7. In other words, yokes 41 may be constructed of intermediate yokes 41b alone.

In the embodiments described so far, the configurations illustrated in the drawings are merely examples and the present invention is by no means limited to such configurations.

Figure 11:
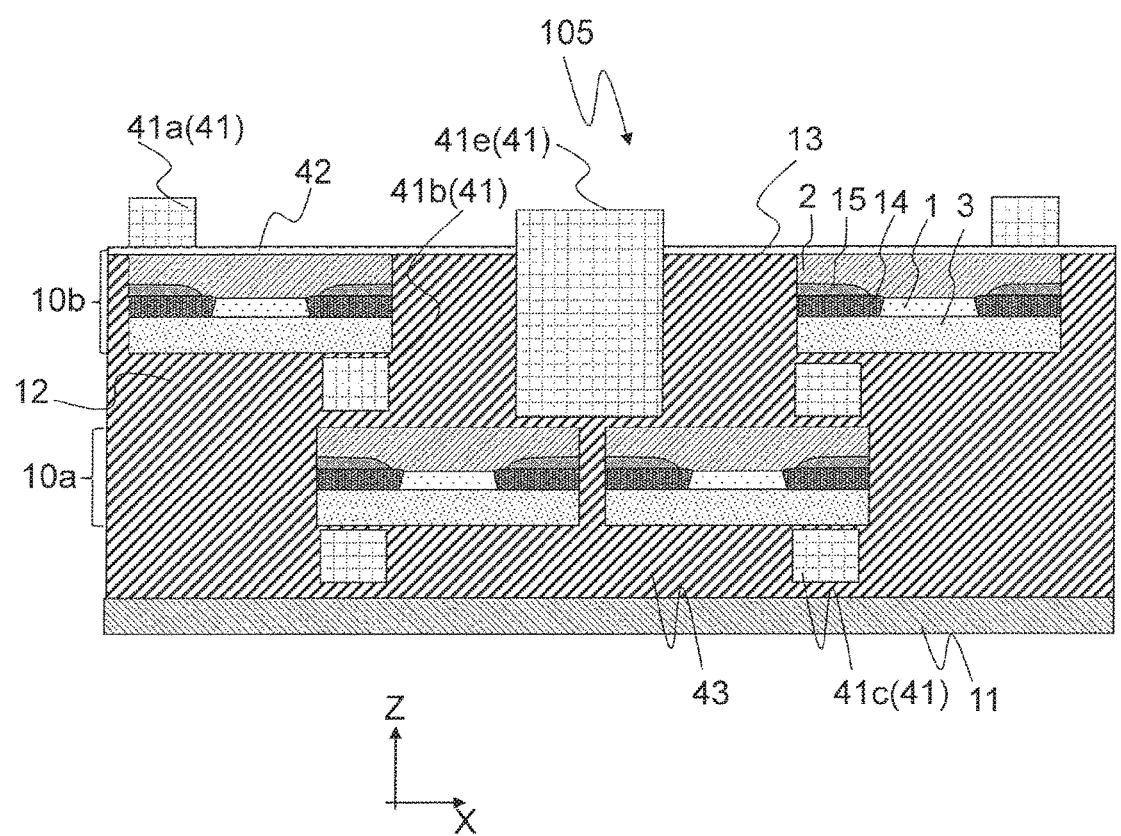
FIG. 11 is a cross-sectional view illustrating a further modification of the magnetic sensor according to the third embodiment of the present invention.

For example, as magnetic sensor 105 shown in FIG. 11, yoke 41e may be provided which extends from the vicinity of upper electrode layer 2 of element array layer 10b to above upper electrode layer 2 of element array layer 10a. However, in this example, since the distance between intermediate yokes 41b and yoke 41e is small, there is concern that part of the magnetic field drawn into yoke 41e may be absorbed by intermediate yokes 41b, making it impossible to supply a magnetic field to magnetoresistance effect element 1 of element array layer 10a sufficiently. In order to solve this problem, increasing the distance between yokes 41b and yoke 41e causes the distance between magnetoresistance effect elements 1 to increase, thus causing density of magnetoresistance effect elements 1 to deteriorate. Therefore, when yokes 41 are arranged, the configurations shown in FIG. 6 to FIG. 10 are preferable.

In the embodiments, when magnetoresistance effect elements 1 in adjacent element array layers 10a and 10b are connected to each other, magnetoresistance effect elements 1 adjacent in the Z-direction orthogonal to the XY plane are connected to each other, but magnetoresistance effect elements 1 adjacent in a direction crossing the XY plane without intersecting it orthogonally may also be connected to each other.

REFERENCE SIGNS LIST

1 Magnetoresistance effect element
1a, 1c Element array
1b Multi-layered element
2 Upper electrode layer
3 Lower electrode layer
4, 5 Lead wire
10, 10a, 10b Element array layer
11 Substrate
12 Inter-layer insulating layer
13 to 15, 42, 43 Insulating layer
21 Fixed magnetization layer
22 Free layer
23 Non-magnetic layer
41 Yoke
100 to 105 Magnetic sensor

What is claimed is:

1. A magnetic sensor comprising a plurality of element array layers that are stacked one on another, each of said element array layers comprising a plurality of magnetoresistance effect elements arranged in parallel in an in-plane direction, wherein
said magnetoresistance effect elements are arranged in two dimensions in each element array layer,
said magnetoresistance effect elements in said plurality of element array layers are the same kind and are connected in series to each other,
the magnetic sensor further comprises a plurality of multi-layered elements in which said magnetoresistance effect elements in said element array layers are connected in series to said magnetoresistance effect elements that are adjacent in a direction in which said element array layers are stacked one on another, and
said multi-layered elements are connected in series to each other.

2. The magnetic sensor according to claim 1, further comprising an upper electrode layer and a lower electrode layer that are arranged at both ends of each of said magnetoresistance effect elements in the direction in which said element array layers are stacked one on another, wherein said upper electrode layer and said lower electrode layer located between said adjacent magnetoresistance effect elements are shared among said multi-layered elements.

3. The magnetic sensor according to claim 1, wherein
each of said magnetoresistance effect elements comprises a fixed magnetization layer having a fixed magnetization orientation, a free layer having a magnetization orientation which changes depending on an external magnetic field and a non-magnetic layer disposed between said fixed magnetization layer and said free layer, and
magnetization orientations of said fixed magnetization layers of said plurality of magnetoresistance effect elements are uniform.

4. The magnetic sensor according to claim 1, further comprising yokes that are disposed in the vicinity of said magnetoresistance effect elements.

5. The magnetic sensor according to claim 4, wherein said magnetoresistance effect elements are arranged so as to sandwich said yokes in a direction crossing the in-plane direction without intersecting the in-plane direction orthogonally.

6. The magnetic sensor according to claim 4, wherein said yokes comprise two interposing yokes that are arranged so as to sandwich said magnetoresistance effect elements in a direction crossing the in-plane direction without intersecting the in-plane direction orthogonally.

7. The magnetic sensor according to claim 6, wherein
said interposing yoke is provided for each of said magnetoresistance effect elements in said plurality of element array layers, and
said interposing yokes provided between the magnetoresistance effect elements adjacent in a direction crossing the in-plane direction without intersecting the in-plane direction orthogonally are provided between said two adjacent element array layers.

8. The magnetic sensor according to claim 7, wherein said interposing yokes provided between the adjacent magnetoresistance effect elements in the direction crossing the in-plane direction without intersecting the in-plane direction orthogonally are shared among said adjacent magnetoresistance effect elements.

9. The magnetic sensor according to claim 4, wherein said yokes comprise side yokes that are arranged on both sides of said magnetoresistance effect elements in the in-plane direction.

10. The magnetic sensor according to claim 9, further comprising an upper electrode layer and a lower electrode layer that are arranged at both ends of each magnetoresistance effect element in the direction in which said element array layers are stacked one on another, wherein said side yokes are arranged between said upper electrode layer and said lower electrode layer.

11. A magnetic sensor comprising a plurality of element array layers that are stacked one on another, each of said element array layers comprising a plurality of magnetoresistance effect elements arranged in parallel in an in-plane direction, wherein said magnetoresistance effect elements in said plurality of element array layers are connected in series to each other, wherein
yokes are disposed in the vicinity of said magnetoresistance effect elements,
said yokes comprise two interposing yokes that are arranged so as to sandwich said magnetoresistance effect elements in a direction crossing the in-plane direction without intersecting the in-plane direction orthogonally,
said interposing yoke is provided for each of said magnetoresistance effect elements in said plurality of element array layers, and
said interposing yokes provided between the magnetoresistance effect elements adjacent in a direction crossing the in-plane direction without intersecting the in-plane direction orthogonally are provided between said two adjacent element array layers and are shared among said adjacent magnetoresistance effect elements.

12. A magnetic sensor comprising a plurality of element array layers that are stacked one on another, each of said element array layers comprising a plurality of magnetoresistance effect elements arranged in parallel in an in-plane direction, wherein said magnetoresistance effect elements in said plurality of element array layers are connected in series to each other, wherein
yokes are disposed in the vicinity of said magnetoresistance effect elements,
said yokes comprise side yokes that are arranged on both sides of said magnetoresistance effect elements in the in-plane direction,
an upper electrode layer and a lower electrode layer that are arranged at both ends of each magnetoresistance effect element in the direction in which said element array layers are stacked one on another, and
said side yokes are arranged between said upper electrode layer and said lower electrode layer.

* * * * *